(12) United States Patent
Chen et al.

(10) Patent No.: US 12,052,838 B2
(45) Date of Patent: Jul. 30, 2024

(54) DISPLAY

(71) Applicant: Qisda Corporation, Taoyuan (TW)

(72) Inventors: Jen-Feng Chen, Taichung (TW);
Yien-Bo Chen, Taoyuan (TW);
Kuan-Hsu Lin, New Taipei (TW);
Hsin-Hung Lin, Taoyuan (TW);
Nien-Tsung Hsu, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 248 days.

(21) Appl. No.: 17/671,685

(22) Filed: Feb. 15, 2022

(65) Prior Publication Data

US 2023/0025782 A1   Jan. 26, 2023

(30) Foreign Application Priority Data

Jul. 22, 2021   (CN) .......................... 202110832618.4

(51) Int. Cl.
| | |
|---|---|
| *H05K 5/02* | (2006.01) |
| *F16M 11/10* | (2006.01) |
| *F16M 13/02* | (2006.01) |
| *H01F 7/02* | (2006.01) |
| *F16M 11/20* | (2006.01) |
| *F16M 11/24* | (2006.01) |

(52) U.S. Cl.
CPC .......... *H05K 5/0234* (2013.01); *F16M 11/10* (2013.01); *F16M 13/022* (2013.01); *H01F 7/02* (2013.01); *F16M 11/2014* (2013.01); *F16M 11/24* (2013.01)

(58) Field of Classification Search
CPC .... H05K 5/0234; F16M 11/10; F16M 13/022; F16M 11/2014; F16M 11/24; H01F 7/02
See application file for complete search history.

(56) References Cited

U.S. PATENT DOCUMENTS

| | | | |
|---|---|---|---|
| 4,844,387 A | 7/1989 | Sorgi et al. | |
| 6,370,741 B1 | 4/2002 | Lu | |
| 6,398,175 B1 | 6/2002 | Conner et al. | |
| 6,418,010 B1 * | 7/2002 | Sawyer | G06F 1/181 |
| | | | 361/801 |
| 6,769,657 B1 * | 8/2004 | Huang | F16M 13/022 |
| | | | 248/278.1 |
| 7,093,811 B2 | 8/2006 | Wu | |

(Continued)

FOREIGN PATENT DOCUMENTS

| | | | |
|---|---|---|---|
| CN | 206175989 U | * | 5/2017 |
| CN | 206175989 U | | 5/2017 |

(Continued)

OTHER PUBLICATIONS

Office action of counterpart application by Taiwan IP Office on Apr. 12, 2022.

*Primary Examiner* — Abhishek M Rathod
*Assistant Examiner* — Martin Antonio Asmat Uceda

(57) ABSTRACT

A display includes a screen, a stand and a hanging element. The stand is connected to the screen and has a first end and a second end. The hanging element is selectively disposed on the first end or the second end. When the hanging element is disposed on the first end, the hanging element could clamp a first plate; when the hanging element is disposed on the second end, the hanging piece could clamp a second plate, wherein the first plate is perpendicular to the second plate.

20 Claims, 11 Drawing Sheets

(56) References Cited

U.S. PATENT DOCUMENTS

| | | | |
|---|---|---|---|
| 7,121,516 B1* | 10/2006 | Koh | F16M 13/022 |
| | | | 248/227.2 |
| 7,546,993 B1 | 6/2009 | Walker | |
| 7,984,881 B2* | 7/2011 | Liu | F16M 11/22 |
| | | | 361/679.01 |
| 9,115,740 B2 | 8/2015 | Chang | |
| 10,216,070 B2* | 2/2019 | Wood | F16M 11/2092 |
| 10,253,926 B1 | 4/2019 | Fan | |
| 11,075,664 B2 | 7/2021 | Lin | |
| 11,480,288 B2* | 10/2022 | Huang | F16M 11/10 |
| 11,603,960 B1* | 3/2023 | Wen | F16M 13/022 |
| 11,802,657 B2 | 10/2023 | Hsieh et al. | |
| 2008/0054133 A1 | 3/2008 | Huang | |
| 2008/0116328 A1* | 5/2008 | Wang | F16M 11/24 |
| | | | 248/122.1 |
| 2008/0164395 A1* | 7/2008 | Chang | F16M 11/2035 |
| | | | 248/276.1 |
| 2008/0179899 A1 | 7/2008 | Yang | |
| 2009/0173853 A1* | 7/2009 | Fawcett | A47F 5/0861 |
| | | | 248/220.31 |
| 2011/0315843 A1 | 12/2011 | Hung | |
| 2012/0273630 A1* | 11/2012 | Gillespie-Brown | F16M 11/105 |
| | | | 248/122.1 |
| 2013/0321715 A1* | 12/2013 | Millson | E04F 19/08 |
| | | | 52/27 |
| 2015/0050077 A1 | 2/2015 | Huang | |
| 2016/0230921 A1 | 8/2016 | Fan | |
| 2017/0293206 A1* | 10/2017 | Wood | F16M 11/2021 |
| 2019/0045143 A1 | 2/2019 | Williams, IV | |
| 2022/0397230 A1 | 12/2022 | Tucker et al. | |
| 2023/0189456 A1 | 6/2023 | Chen et al. | |

FOREIGN PATENT DOCUMENTS

| | | | |
|---|---|---|---|
| CN | 105937688 B | | 5/2018 |
| CN | 207814783 U | * | 9/2018 |
| WO | WO-2020248392 A1 | * | 12/2020 |

* cited by examiner

DISPLAY

This application claims the benefit of People's Republic of China application Serial No. 202110832618.4, filed on Jul. 22, 2021, the subject matter of which is incorporated herein by reference.

BACKGROUND OF THE INVENTION

Field of the Invention

The invention relates in general to a display.

Description of the Related Art

Conventional display includes a screen, a stand and a base. The stand connects the screen with the base. In order to adjust an angle of the screen, the screen and the stand are usually pivotally connected in a relatively rotatable manner. The base is limited to lying flat on a flat surface (for example, desktop). However, such a structure limits the application of the display. Therefore, how to propose a new display to improve the aforementioned problems is one of the directions of the industry in this technical field.

SUMMARY OF THE INVENTION

The present invention relates to a display capable of resolving the above problems.

According to one embodiment of the present invention, a display is provided. The display includes a screen, a stand connected to the screen and having a first end and a second end and a hanging element selectively disposed on the first end or the second end. When the hanging element is disposed on the first end, the hanging element clamps a first plate; when the hanging element is disposed on the second end, the hanging element clamps a second plate, wherein the first plate is perpendicular to the second plate.

According to another embodiment of the present invention, a display is provided. The display includes a screen, a stand connected to the screen and having a first end and a second end, a hanging element selectively disposed on the first end or the second end and a base detachably connected to the first end. When the base connects the first end, the display supports the screen by the base; when the base is detached and the hanging element is disposed on the first end, the hanging element clamps a second plate; when the hanging element is disposed on the second end, the hanging element clamps a first plate. Wherein the first plate is perpendicular to the second plate.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
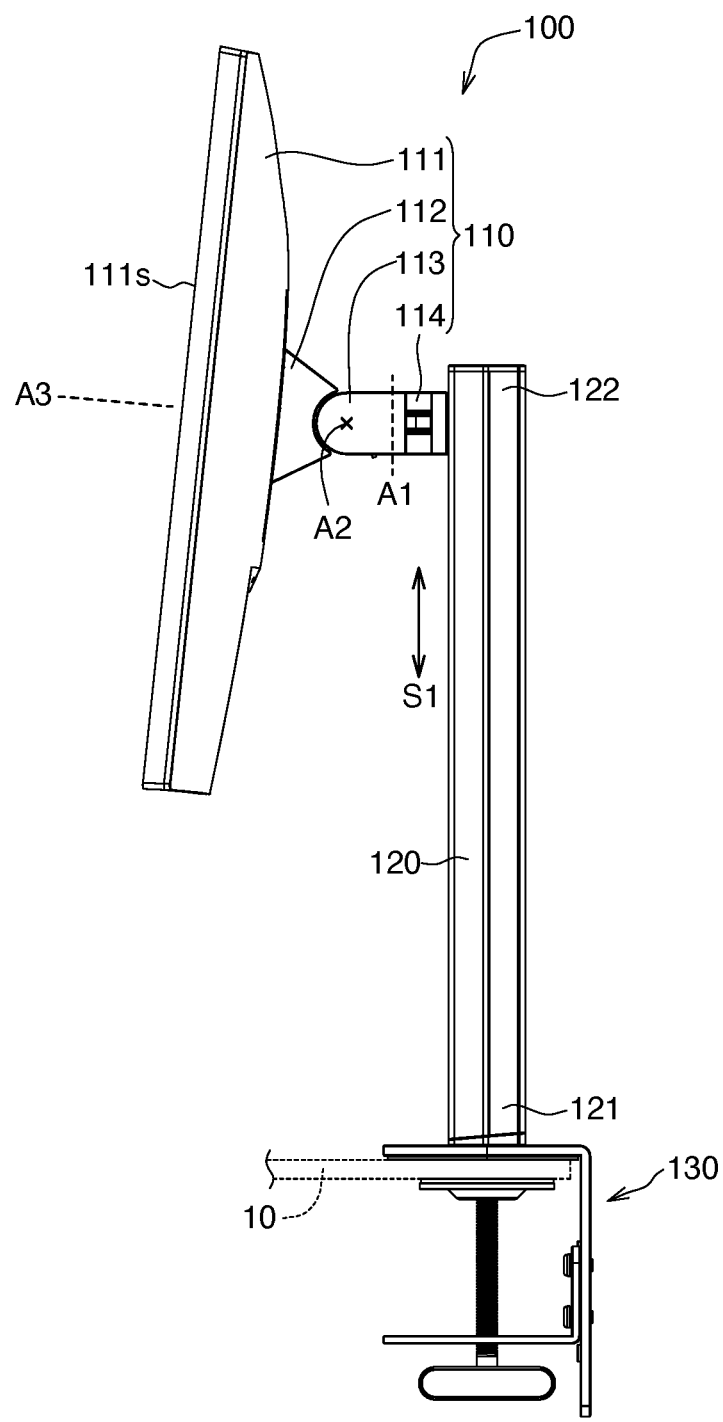
FIG. 1A shows a schematic diagram of a side view of a display according to an embodiment of the present invention.
Figure 1B:
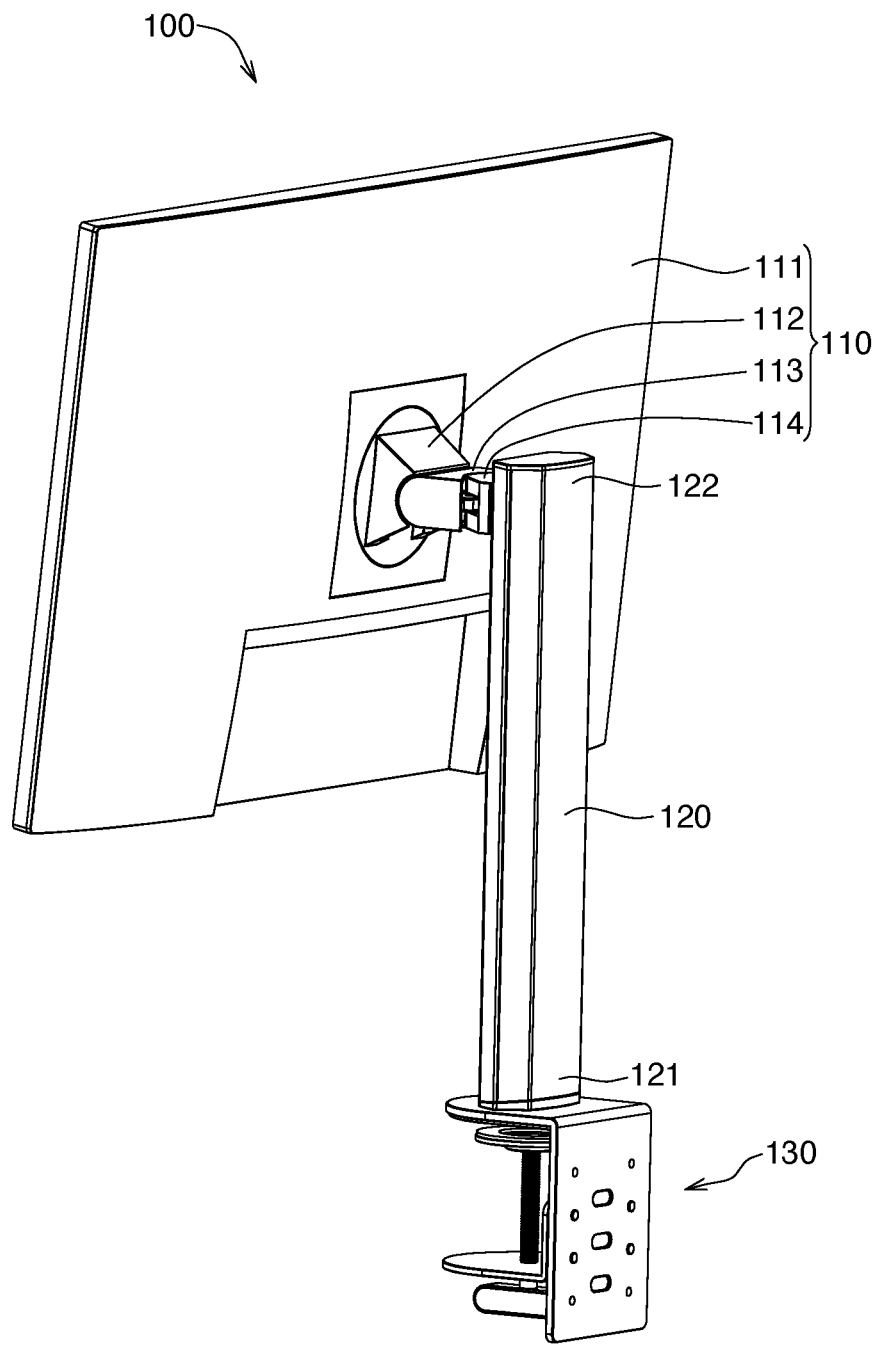
FIG. 1B shows a schematic diagram of a perspective view of the display of FIG. 1A.
Figure 1C:
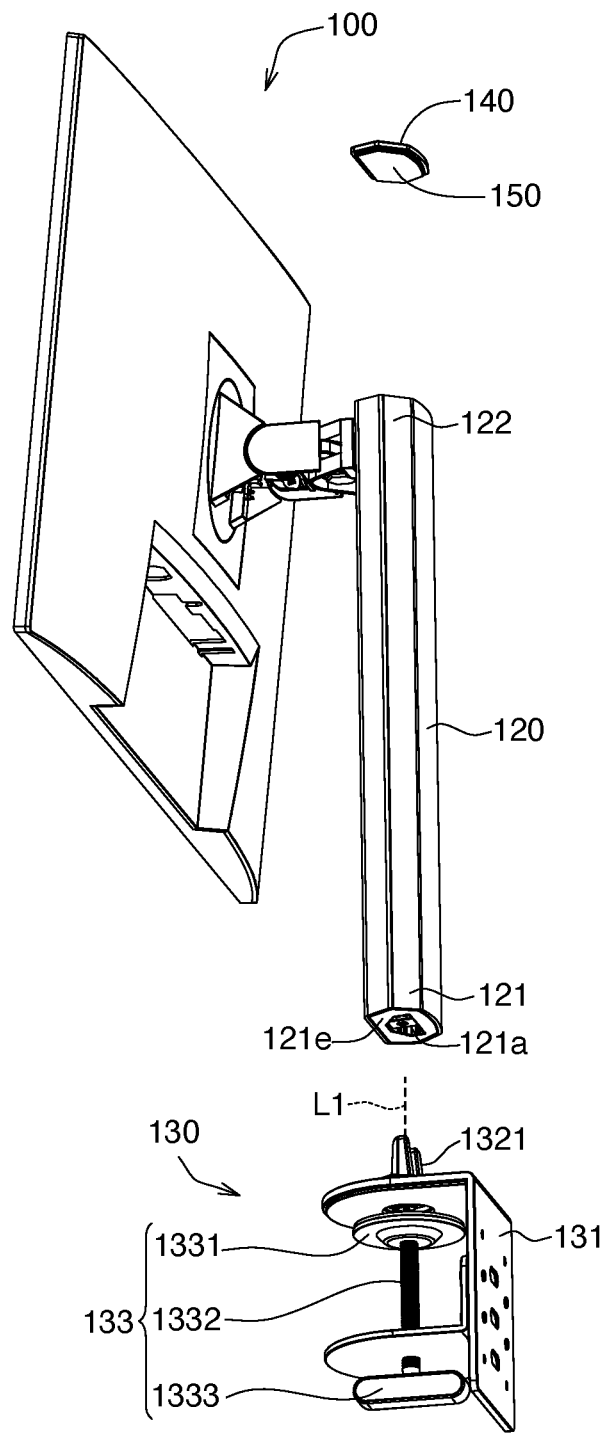
FIGS. 1C and 1D show schematic diagrams of exploded views of the display of FIG. 1B at different viewing angles.
Figure 1D:
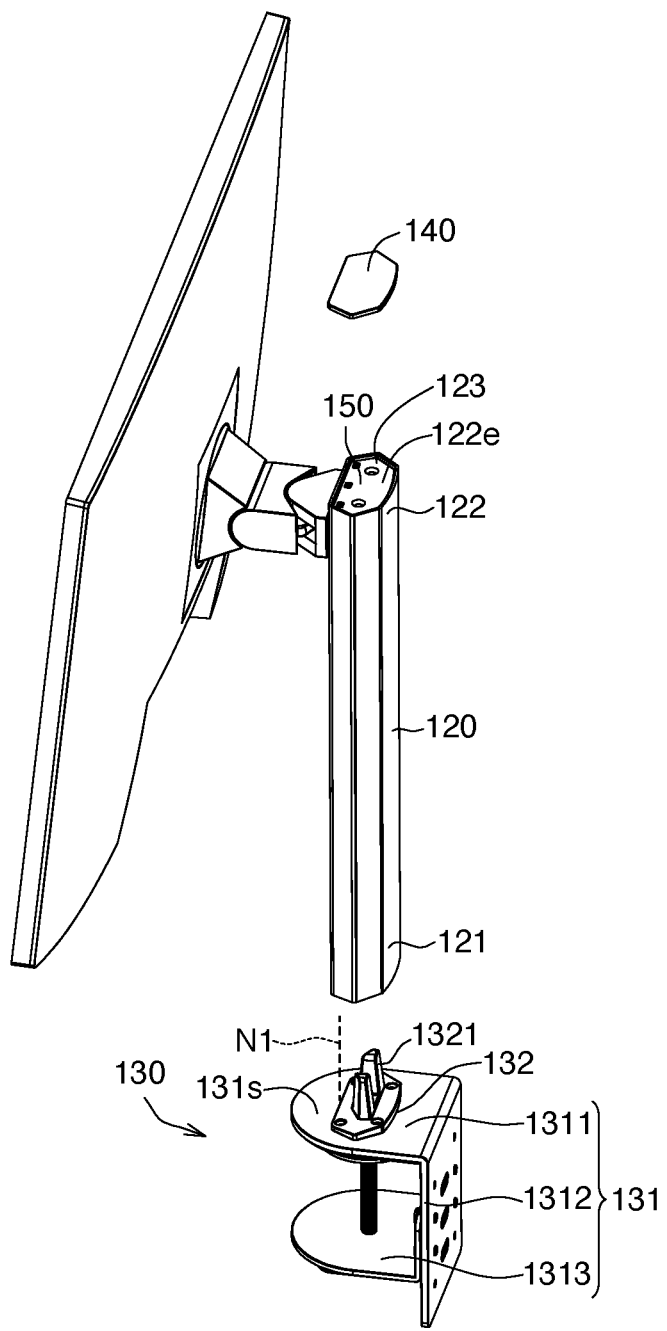
Figure 1E:
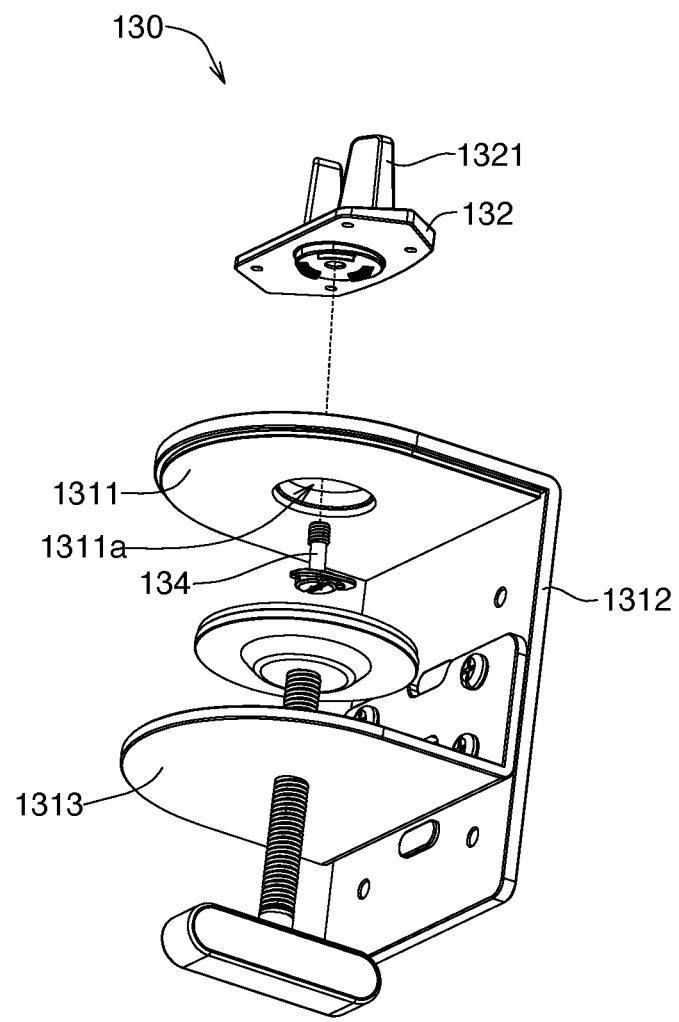
FIG. 1E shows a schematic diagram of an exploded view of a hanging element of FIG. 1A.
Figure 2A:
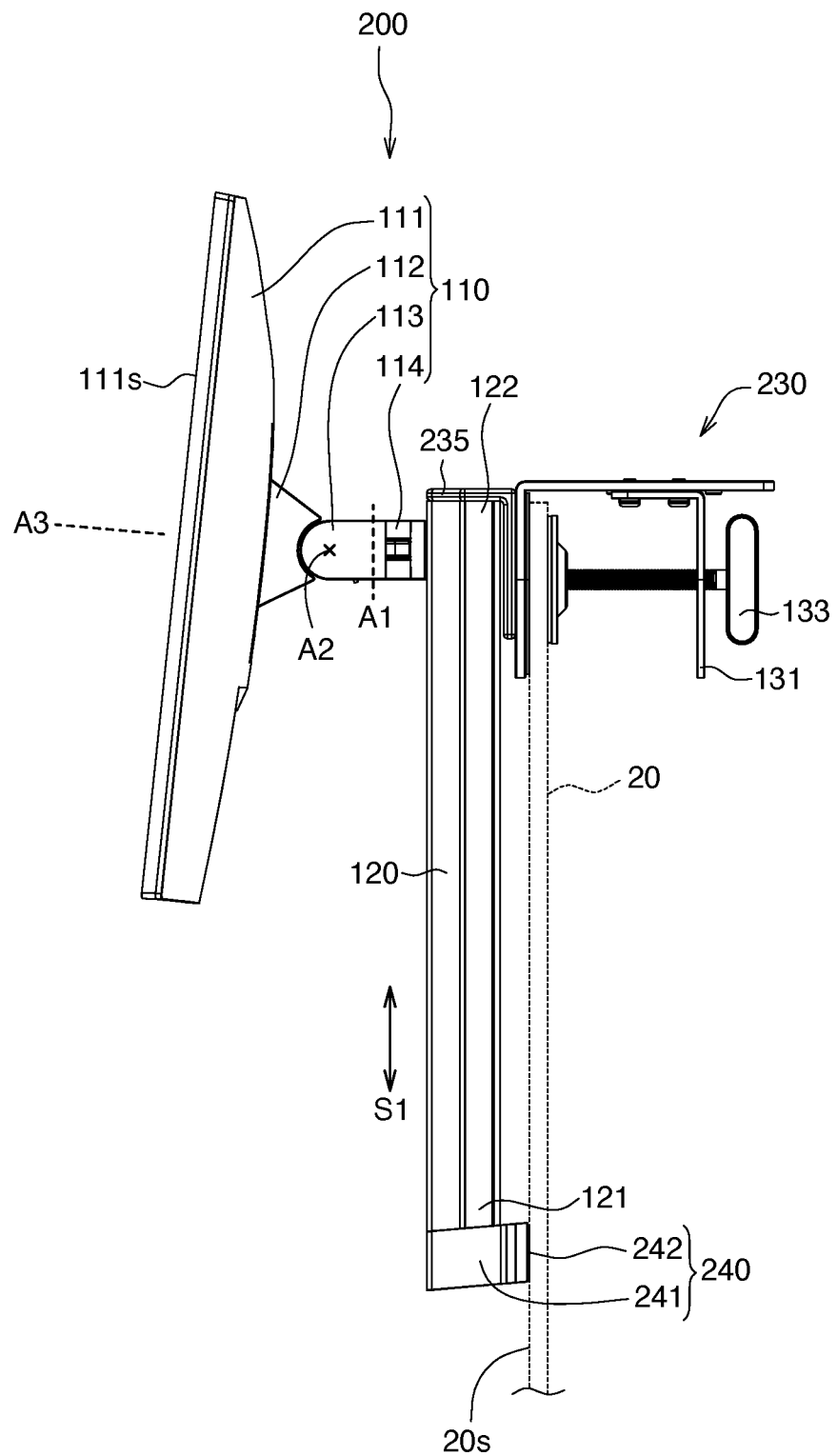
FIG. 2A shows a schematic diagram of a side view of a display according to another embodiment of the present invention.
Figure 2B:
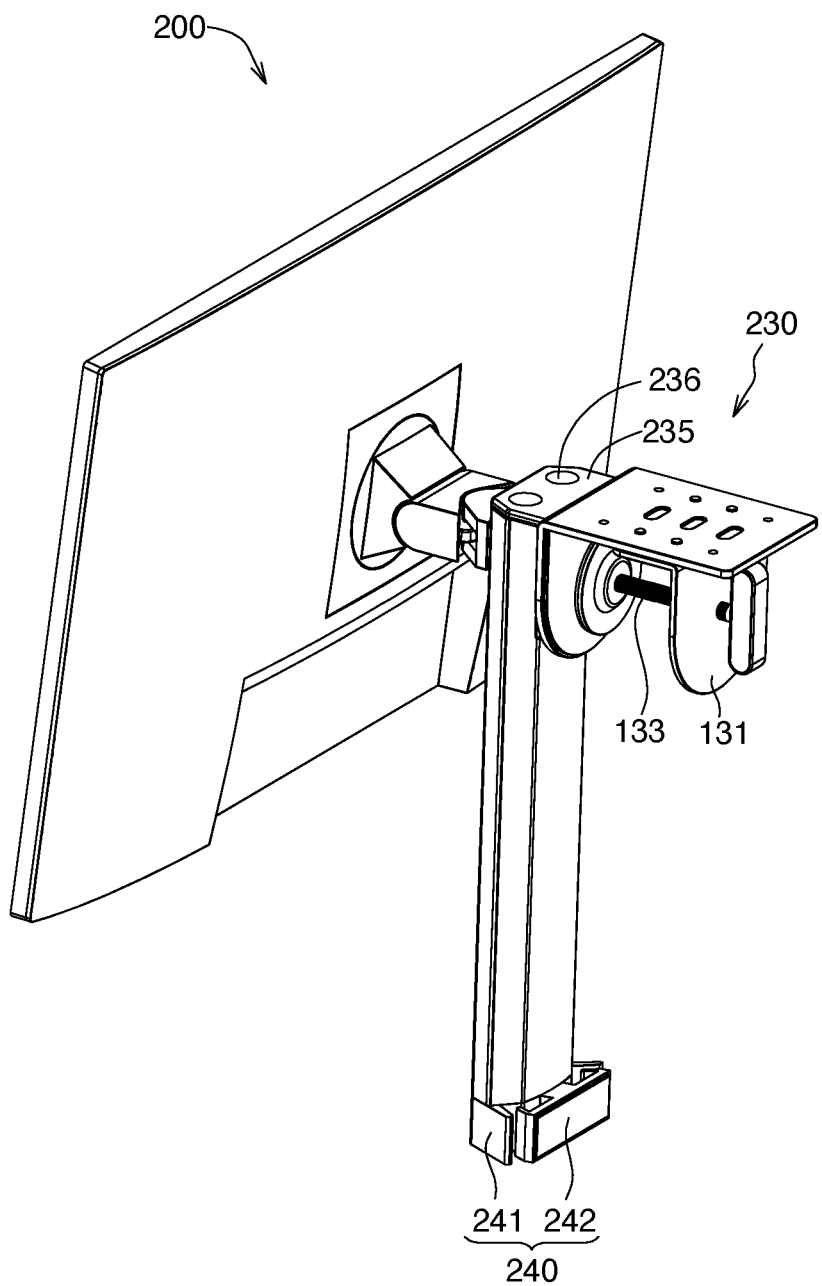
FIG. 2B shows a schematic diagram of a perspective view of the display of FIG. 2A.
Figure 2C:
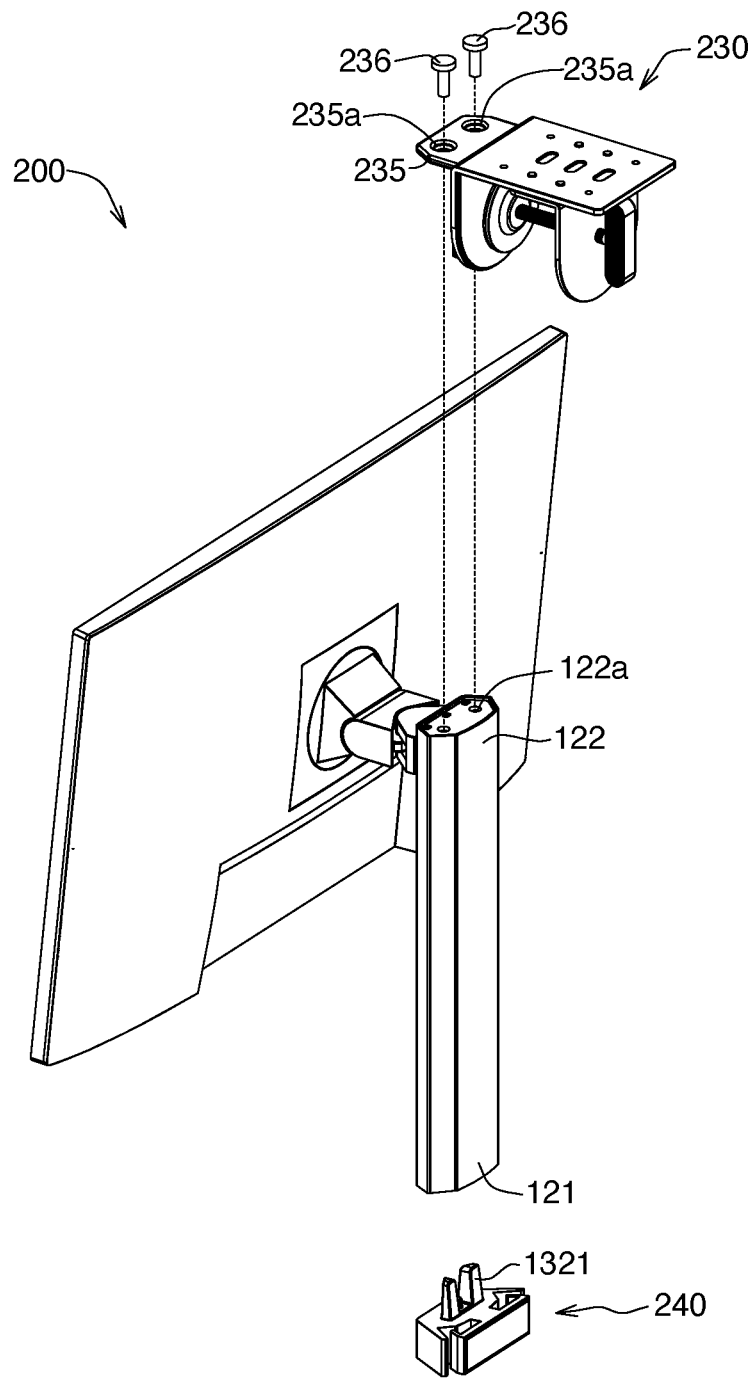
FIG. 2C shows a schematic diagram of an exploded view of the display of FIG. 2B.
Figure 2D:
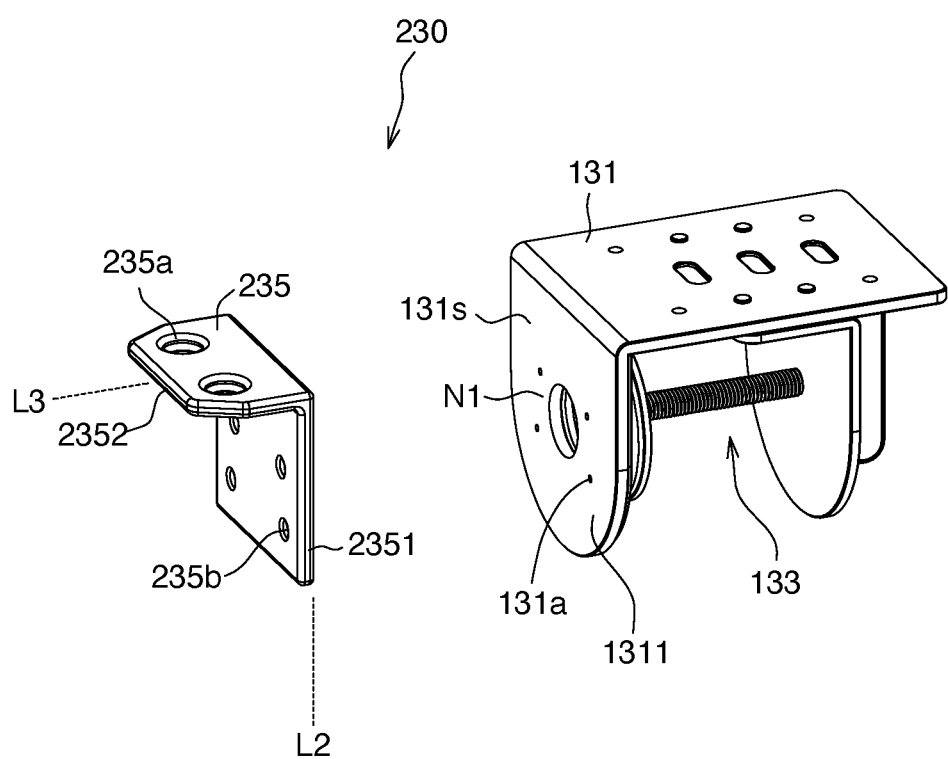
FIG. 2D shows a schematic diagram of an exploded view of the hanging element of FIG. 2A.

Referring to FIGS. 1A to 1E and 2A to 2D, FIG. 1A shows a schematic diagram of a side view of a display 100 according to an embodiment of the present invention, FIG. 1B shows a schematic diagram of a perspective view of the display 100 of FIG. 1A, FIGS. 1C and 1D show schematic diagrams of exploded views of the display 100 of FIG. 1B at different viewing angles, FIG. 1E shows a schematic diagram of an exploded view of a hanging element 130 of FIG. 1A, FIG. 2A shows a schematic diagram of a side view of a display 200 according to another embodiment of the present invention, FIG. 2B shows a schematic diagram of a perspective view of the display 200 of FIG. 2A, FIG. 2C shows a schematic diagram of an exploded view of the display 200 of FIG. 2B, and FIG. 2D shows a schematic diagram of an exploded view of the hanging element 230 of FIG. 2A.

As shown in FIGS. 1A and 2A, the display 100 (as shown in FIG. 1A) and the display 200 (as shown in FIG. 2A) each include a screen 110, a stand (or supporter) 120 and a hanging element (130, 230). The stand 120 is connected to the screen 110 and has a first end 121 and a second end 122. The hanging element (130, 230) could be selectively disposed at the first end 121 or the second end 122. For example, as shown in FIG. 1A, when the hanging element 130 is disposed at the first end 121, the hanging element 130 could clamp a first plate 10. For another example, when the hanging element 230 is disposed at the second end 122, the hanging element 230 could clamp an upper edge of a second plate 20. The first plate 10 and the second plate 20 are substantially perpendicular. As a result, depending on requirements and/or the extending direction of the plate, the hanging element could be selectively disposed on one of the first end 121 and the second end 122.

As shown in FIGS. 1A and 2A, when the display 100 clamps the first plate 10 or the second plate 20, relative position between the first plate 10 and the ends (the first end 121 and the second end 122) of the stand 120 is fixed. As a result, the screen 110 could rotate relative to the stand 120 (if the stand 120 is rotatable relative to the first plate 10, the screen 110 will move with the stand 120, but could not rotate relative to the stand 120).

As shown in FIGS. 1A and 2A, the screen 110 includes a screen body (for example, a display panel) 111, a first pivoting element 112, a second pivoting element 113 and a third pivoting element 114. The screen body 111 could rotate relative to the stand 120 around at least one rotating shaft (or axial direction). The third pivoting element 114 and the second pivoting element 113 are rotatably connected (swivel) relative to a first rotation axis (or axial direction) A1, the first pivoting element 112 and the second pivoting element 113 are rotatably connected (tilt) relative to a second rotation axis A2, and the screen body 111 and the first pivoting element 112 are pivotably connected (pivot) rotatably relative to a third rotation axis A3, wherein two of the first rotation axis A1, the second rotation axis A2 and the third rotation axis A3 are, for example, perpendicular to each other, and the third rotation axis A3 is, for example, parallel to a normal direction of a display surface 111s of the screen body 111. In addition, the third pivoting element 114 and the stand 120 are relatively slidably disposed along an extension direction S1 of the stand 120. For example, the stand 120 has at least one sliding groove (not shown), and the third pivoting element 114 has at least one sliding block (not shown). The sliding block is pivotally connected to the sliding groove, so that the third pivoting element 114 and the stand 120 could relatively slide.

As described above, the screen body 111 could rotate around the first rotation axis A1, the second rotation axis A2 and/or the third rotation axis A3 and/or could slide along the extension direction S1 of the stand 120. As long as the screen body 111 could rotate around the first rotation axis A1, the second rotation axis A2 and/or the third rotation axis A3, the present invention does not limit the pivoting manner, structure and/or degree of freedom (DOF) of movement of the stand 120 and the screen 110.

The structure of the display 100 and the display 200 could be partially the same or completely different. The structure of the display 100 will be described below.

As shown in FIGS. 1C and 1D, the first end 121 of the stand 120 has a first end surface 121e and at least one first fixing hole 121a, wherein the first fixing hole 121a is recessed relative to the first end surface 121e. The hanging element 130 includes a hanging frame 131 and a first adapter element 132. The first adapter element 132 connects the hanging frame 131 and the first end 121 of the stand 120 and includes at least one fixing post 1321. The fixing post 1321 and the first fixing hole 121a could be temporarily engaged to fix relative position between the hanging element 130 and the stand 120.

As shown in FIGS. 1C and 1D, the hanging frame 131 has an adapter surface 131s, the first adapter element 132 is disposed on the adapter surface 131s, and a long-axis direction L1 of the fixing post 1321 of the first adapter element 132 is substantially parallel to a normal direction N1 of the adapter surface 131s. As shown in FIG. 1E, the hanging frame 131 further includes a fixing element 134. The hanging frame 131 has a through hole 1311a. The fixing element 134 passes through the through hole 1311a and is screwed to the first adapter element 132 to fix relative position between the hanging frame 131 and the first adapter element 132.

As shown in FIGS. 1C and 1D, the hanging frame 131 includes a first plate element 1311, a second plate element 1312 and a third plate element 1313, wherein the second plate element 1312 connects the first plate element 1311 and the third plate element 1313. The first plate element 1311, the second plate element 1312 and the third plate element 1313 could form a U-shaped structure. In an embodiment, at least two of the first plate element 1311, the second plate element 1312 and the third plate element 1313 could be an integrally formed structure (or one-piece structure), or at least two of the first plate element 1311, the second plate element 1312 and the third plate element 1313 could be formed separately, and then connected by using suitable bonding techniques, such as welding, engaging, screwing, bonding, etc.

As shown in FIGS. 1C to 1D, the hanging element 130 further includes a pressing module 133 which could press the first plate 10 (the first plate 10 is shown in FIG. 1A) against the hanging frame 131. The pressing module 133 includes a pressing element 1331, a connecting rod 1332 and an operating element 1333, wherein the connecting rod 1332 connects the pressing element 1331 and the operating element 1333. The pressing element 1331 could be disposed between the first plate element 1311 and the third plate element 1313 and could press the first plate 10 against the first plate 1311. The connecting rod 1332 could pass through the hanging frame 131, such as the third plate element 1313 of the hanging frame 131. The connecting rod 1332 and the third plate element 1313 could be screwed together. As a result, when the pressing element 1331 presses the first plate 10 against the first plate element 1311, the threads (not shown) of the connecting rod 1332 and the threads (not shown) of the third plate 1313 could generate mutual pressing force (or reaction force) to avoid loosening of the pressing element 1331. In addition, the operating element 1333 is disposed on an outer side of the third plate element 1313, and accordingly it is convenient for the operator to operate the display.

As shown in FIGS. 1C and 1D, the display 100 further includes a shutter 140 and a first magnetic element 150. The shutter 140 is disposed on a second end surface 122e of the second end 122. The first magnetic element 150 is disposed on the shutter 140. The stand 120 includes a second magnetic element 123 having the aforementioned second end surface 122e. The first magnetic element 150 and the second magnetic element 123 could be attracted by magnetic attraction to fix relative position of the shutter 140 and the stand 120. In an embodiment, one of the first magnetic element 150 and the second magnetic element 123 is, for example, a magnet, and the other of the first magnetic element 150 and the second magnetic element 123 is, for example, a magnetic element that could induce a magnetic field with the magnet.

The structure of the display 200 will be described below.

The display 200 and the display 100 each include at least one common element. For example, the display 200 and the display 100 could share the screen 110 and the stand 120, but the embodiment of the present invention is not limited thereto.

As shown in FIGS. 2B and 2C, in addition to the screen 110 and the stand 120, the display 200 further includes a hanging element 230 and a fixing element 240. The second end 122 of the stand 120 has a second end surface 122e and at least one second fixing hole 122a, and the second fixing hole 122a is recessed relative to the second end surface 122e. The hanging element 230 and the hanging element 130 each include at least one common element. For example, the hanging element 230 and the hanging element 130 could share the hanging frame 131, the pressing module 133 and the fixing element 134. In addition to the hanging frame 131, the pressing module 133 and the fixing element 134, the hanging element 230 of the display 200 further includes a second adapter element 235 and at least one fastener 236. As shown in FIG. 2D, the second adapter element 235 is fixed to the hanging frame 131. For example, the hanging frame 131 has at least one fixing hole 131a, and the second adapter element 235 has at least one through hole 235b. At least one fixing element (not shown) could pass through the corresponding through hole 235b and be fixed to the corresponding fixing hole 131a to fix relative position between the second adapter element 235 and the hanging frame 131. In an embodiment, the fixing element is, for example, a threaded element, and the fixing hole 131a is, for example, a screw hole.

As shown in FIGS. 2B and 2C, the second adapter element 235 connects the hanging frame 131 and the second end 122 of the stand 120 and has at least one through hole 235a. The fastener 236 passes through the through hole 235a and is fixed to the second fixing hole 122a to fix relative position of the second adapter element 235 and the stand 120. In an embodiment, the fastener 236 is, for example, a threaded element, and the through hole 235a is, for example, a screw hole.

As shown in FIG. 2D, the hanging frame 131 of the hanging element 230 has the adapter surface 131s, and the second adapter element 235 includes a first plate element 2351 and a second plate element 2352. The first plate element 2351 is disposed on the adapter surface 131s of the hanging frame 131. The second plate element 2352 is connected to the first plate element 2351, and the second plate element 2352 and the first plate element 2351 are disposed perpendicularly. The extension direction L2 of the first plate element 2351 is perpendicular to the normal direction N1 of the adapter surface 131s, and the extension direction L3 of the second plate element 2352 is parallel to the normal direction N1 of the adapter surface 131s.

As shown in FIG. 2A, when the hanging element 230 is disposed on the second end 122, the fixing element 240 could be disposed on the first end 121 and fixed on a surface 20s of the second plate 20. The fixing element 240 has magnetism, and the fixing element 240 and the surface 20s of the second plate 20 could be combined through magnetic attraction to stabilize the relative position between the display 200 and the second plate 20. In the present embodiment, the surface 20s itself could have a material that have magnetism or could be magnetically attracted. In another embodiment, a magnetic element or a material that could be magnetically attracted (not shown) could be disposed on the surface 20s so that the magnetic fixing element 240 is combined with the magnetic element or a magnetically attractable material (not shown) disposed on the surface 20s of the second plate 20 by the magnetic attraction force.

As shown in FIGS. 2A to 2C, the fixing element 240 could include a main body 241 and a fixing portion 242, wherein the fixing portion 242 is disposed on the main body 241, and the main body 241 could include at least one fixing post 1321. The fixing post 1321 and the first fixing hole 121a (not shown in FIGS. 2A to 2C) of the stand 120 could be temporarily engaged for fixing relative position between the fixing element 240 and the stand 120. In addition, one of the fixing portion 242 and the magnetic element disposed on the surface 20s is, for example, a magnet, and the other of the fixing portion 242 and the magnetic element is, for example, a magnet or a magnetic element that could generate an induced magnetic field with the magnet, so that the magnetic fixing element 240 is combined with the magnetic element or a magnetically attractable material (not shown) disposed on the surface 20s of the second plate 20 by the magnetic attraction force.

Figure 3:
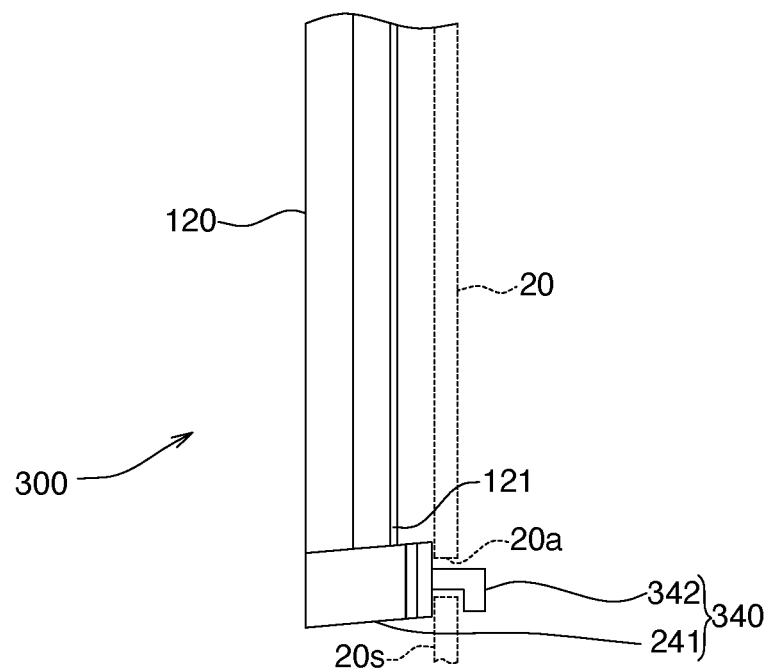
FIG. 3 shows a schematic diagram of a display according to another embodiment of the present invention.

Referring to FIG. 3, FIG. 3 shows a schematic diagram of a display 300 according to another embodiment of the present invention. The display 300 includes the screen 110 (not shown), the stand 120, a hanging element 230 (not shown) and a fixing element 340. The display 300 of the embodiment of the present invention has the technical features the same as or similar to that of the aforementioned display 200, except that the fixing element 340 and the second plate 20 are combined through the engagement technology.

As shown in FIG. 3, the fixing element 340 includes a main body 241 and a fixing portion 342, wherein the fixing element 340 is detachably disposed on the first end 121 of the stand 120, and the fixing portion 342 is disposed on the main body 241. In the present embodiment, the fixing portion 342 is, for example, a hook. The second plate 20 has an engaging hole 20a extending away from the display 300 from the surface 20s, and the fixing portion 342 is hooked with the engaging hole 20a for fixing relative position between the second plate 20 and the fixing portion 342.

Figure 4:
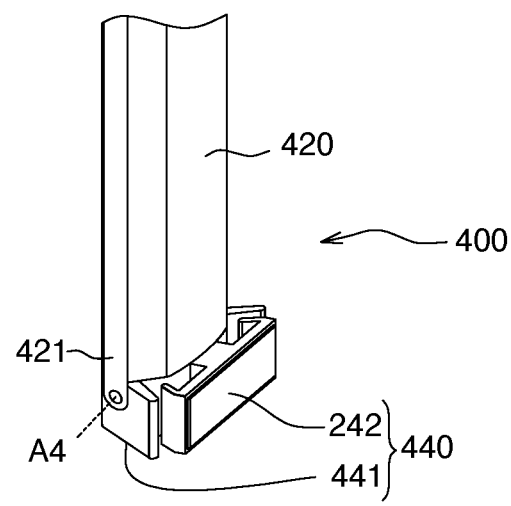
FIG. 4 shows a schematic diagram of a display according to another embodiment of the present invention.

Referring to FIG. 4, FIG. 4 shows a schematic diagram of a display 400 according to another embodiment of the present invention. The display 400 includes the screen 110 (not shown), the stand 420, the hanging element 230 (not shown) and a fixing element 440. The display 400 of the embodiment of the present invention has the technical features the same as or similar to that of the aforementioned display 200, except that the first end 421 of the stand 420 is pivotally connected to the fixing element 440 relatively rotatably. A first end 421 of the stand 420 and the fixing element 440 are rotatably connected around a pivot axis A4, so that the stand 420 and the fixing element 440 could relatively rotate around the pivot axis A4. The pivot axis A4 is parallel to the extension direction of the surface 20s of the second plate 20. In the present embodiment, the pivot axis A4 is, for example, parallel to the first rotation axis A1.

As shown in FIG. 4, the fixing element 440 could include a main body 441 and a fixing portion 242, wherein the fixing portion 242 is disposed on the body 441, and the main body 241 and the first end 421 of the stand 420 could be relatively rotated around the pivot axis A4.

Although the display 100 of the foregoing embodiment includes the hanging element 130 and the display 200 includes the hanging element 230 as an example, in other embodiment, the display 100 could further include the hanging element 230 and/or the display 200 could further includes the hanging element 130 for increasing the flexibility of the display 100 and the display 200 in configuration.

Figure 5:
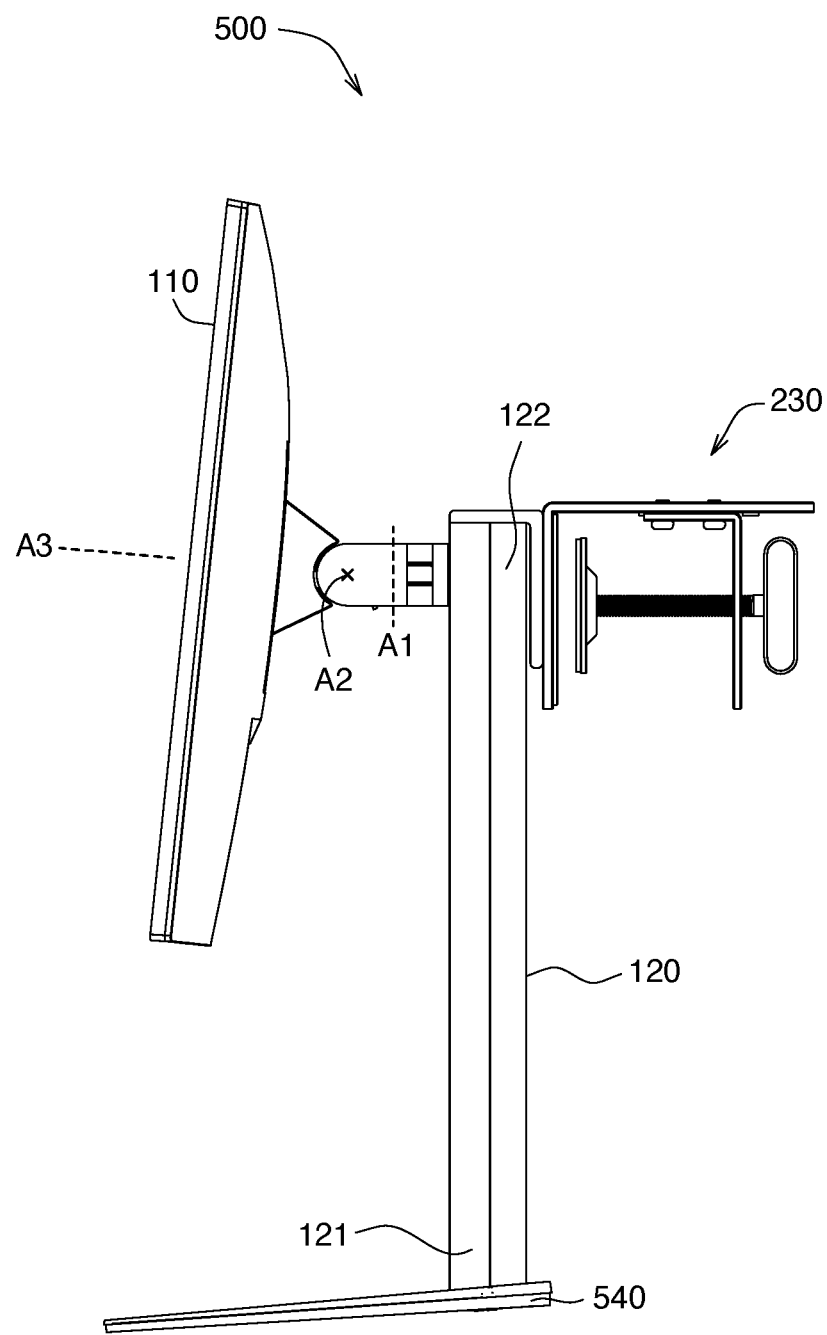
FIG. 5 shows a schematic diagram of a display according to another embodiment of the present invention.

Referring to FIG. 5, FIG. 5 shows a schematic diagram of a display 500 according to another embodiment of the present invention. The display 500 includes the screen 110, the stand 120, the hanging element 230 and a base 540. The display 500 of the embodiment of the present invention has the technical features the same as or similar to that of the aforementioned display 200, expect for the display 500 further includes the base 540 disposed on a carrier, such as a ground or a desktop.

The base 540 is detachably connected to the first end 121 of the stand 120. When the base 540 is connected to the first end 121, the display 500 supports the screen 110 through the base 540. When the base 540 is disassembled, the screen 110 could be hung on the upper edge of the second plate 20 (the second plate 20 is shown in FIG. 2A) by the hanging element 230. Although not shown, the base 540 could include at least one fixing post 1321, wherein the fixing post 1321 and the first fixing hole 121a (not shown in FIG. 5) of the stand 120 could be temporarily engaged for fixing relative position between the fixing element 240 and the stand 120. In addition, the base 540 and the first end 121 of the stand 120 could be screwed together, for example. For example, a threaded element (not shown) could be screwed from a bottom surface of the base 540 to the first end 121 of the stand 120 to fix relative position between the base 540 and the stand 120. However, the embodiment of the present invention does not limit way of combining the base 540 with the stand 120, and it could also be combined through an engagement technology.

In the present embodiment, although not shown in FIG. 5, the display 500 further includes the fixing element 240 which is detachably disposed on the first end 121 of the stand 120. When the base 540 is detached, the fixing element 240 could be connected to the first end 121 and fixed to the surface 20s of the second plate 20, as shown in FIG. 2A.

While the invention has been described by way of example and in terms of the preferred embodiment(s), it is to be understood that the invention is not limited thereto. On the contrary, it is intended to cover various modifications and similar arrangements and procedures and the scope of the appended claims therefore should be accorded the broadest interpretation so as to encompass all such modifications and similar arrangements and procedures.

What is claimed is:

1. A display, comprising:
    a screen;
    a stand connected to the screen and having a first end and a second end; and
    a hanging element selectively disposed on the first end or the second end and comprising a hanging frame;
    wherein when the hanging element is disposed on the first end, the hanging element clamps a first plate and further comprises a first adapter element connecting the hanging frame with the first end; when the hanging element is disposed on the second end and further comprises a second adapter element connecting the hanging frame with the second end, the hanging element clamps a second plate, wherein the first plate is perpendicular to the second plate.

2. The display according to claim 1, wherein the first end of the stand has a first end surface and a first fixing hole, and the first fixing hole is recessed relative to the first end surface; the hanging element comprises:
    wherein the first adapter element comprises a fixing post, and the fixing post is engaged with the first fixing hole.

3. The display according to claim 2, further comprises:
    a shutter disposed on a second end surface of the second end.

4. The display according to claim 3, further comprises:
    a first magnetic element disposed on the shutter;
    wherein the stand comprises a second magnetic element, and the second magnetic element has the second end surface;
    wherein the first magnetic element and the second magnetic element are attracted by magnetic attraction.

5. The display according to claim 2, wherein the hanging frame has an adapter surface on which the first adapter element is disposed, and the fixing post of the first adapter element has a long-axis direction substantially parallel to a normal direction of the adapter surface.

6. The display according to claim 1, wherein the second end of the stand has an end surface and a fixing hole, the fixing hole is recessed relative to the end surface, and the second adapter element has a through hole; the hanging element comprises:
    a fixing element passing through the through hole and fixed to the fixing hole.

7. The display according to claim 6, wherein the hanging frame has an adapter surface, and the second adapter element comprises:
    a first plate element disposed on the adapter surface; and
    a second plate element connected to the first plate element, wherein the second plate element and the first plate element are perpendicular;
    wherein the first plate element has an extension direction perpendicular to a normal direction of the adapter surface, and the second plate element has an extension direction parallel to the normal direction of the adapter surface.

8. The display according to claim 1, wherein the hanging frame has an adapter surface, and
    the first adapter element or the second adapter element is disposed on the adapter surface;
    wherein the first adapter element has a structure different from that of the second adapter element; when the first adapter element is disposed on the hanging frame, the hanging element connects the first end by the first adapter element; when the second adapter element is disposed on the hanging frame, the hanging frame connects the second end by the second adapter element.

9. The display according to claim 1, further comprises:
    a fixing element;
    wherein when the hanging element is disposed on the second end, the fixing element is disposed on the first end and fixed to a surface of the second plate.

10. The display according to claim 9, wherein the fixing element has magnetism, and the fixing element and the surface of the second plate are combined through magnetic attraction.

11. The display according to claim 9, wherein the fixing element comprises a hook, the second plate has an engaging hole extending from the surface in a direction away from the display, and the hook is hooked with the engaging hole.

12. The display according to claim 1, further comprises:
    a fixing element;
    wherein the second end of the stand is rotatably connected with the fixing element around a pivot axis, and the pivot axis is parallel to a surface of the second plate.

13. A display, comprises:
    a screen;
    a stand connected to the screen and having a first end and a second end;
    a hanging element selectively disposed on the first end or the second end; and
    a base detachably connected to the first end;
    wherein when the base connects the first end, the display supports the screen by the base; when the base is detached and the hanging element is disposed on the first end, the hanging element clamps a second plate; when the hanging element is disposed on the second end, the hanging element clamps a first plate;
    wherein the first plate is perpendicular to the second plate.

14. The display according to claim 13, wherein the second end of the stand has an end surface and a fixing hole, and the fixing hole is recessed relative to the end surface; the hanging element comprises:
    a hanging frame;
    an adapter element connecting the hanging frame and the second end and having a through hole; and
    a fixing element passing through the through hole and fixed to the fixing hole.

15. The display according to claim 14, wherein the hanging frame has an adapter surface, and the adapter element comprises:
    a first plate element disposed on the adapter surface; and
    a second plate element connected to the first plate element, wherein the second plate element and the first plate element are perpendicular;

wherein the first plate element has an extension direction perpendicular to a normal direction of the adapter surface, and the second plate element has an extension direction parallel to the normal direction of the adapter surface.

16. The display according to claim 13, further comprises:
a fixing element;
wherein when the hanging element is disposed on the second end, the fixing element is disposed on the first end and fixed to a surface of the second plate.

17. The display according to claim 16, wherein the fixing element has magnetism, and the fixing element and the surface of the second plate are combined through magnetic attraction.

18. The display according to claim 16, wherein the fixing element comprises a hook, the second plate has an engaging hole extending from the surface in a direction away from the display, and the hook is hooked with the engaging hole.

19. The display according to claim 13, wherein the base further comprises at least one fixing post, the first end of the stand has an end surface and a fixing hole recessed relative to the end surface, and the fixing post is engaged with the fixing hole of the stand.

20. The display according to claim 13, wherein the base is screwed to the first end of the stand.

* * * * *